(12) United States Patent
Schneider

(10) Patent No.: US 7,492,290 B1
(45) Date of Patent: Feb. 17, 2009

(54) ALTERNATIVE ENCODING FOR LZSS OUTPUT

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 0 days.

(21) Appl. No.: 11/893,571

(22) Filed: Aug. 15, 2007

(51) Int. Cl.
*H03M 7/40* (2006.01)

(52) U.S. Cl. .......................................... 341/67; 341/87
(58) Field of Classification Search .................. 341/51, 341/63, 65, 67, 106, 87
See application file for complete search history.

(56) References Cited

U.S. PATENT DOCUMENTS

| 5,155,484 | A | 10/1992 | Chambers, IV |
| 6,693,567 | B2 * | 2/2004 | Cockburn et al. ............. 341/51 |
| 6,927,706 | B2 * | 8/2005 | Horie ........................... 341/51 |
| 7,109,895 | B1 * | 9/2006 | Langhammer ................ 341/51 |
| 7,321,937 | B2 * | 1/2008 | Fallon ......................... 709/231 |

* cited by examiner

*Primary Examiner*—Brian Young
(74) *Attorney, Agent, or Firm*—Blakely, Sokoloff, Taylor & Zafman LLP

(57) ABSTRACT

A data processing method where a source bit stream is manipulated to produce four intermediate streams: flag bits, literals, offsets and lengths. Flag bits are grouped into multi-bit units, and an output stream containing flag units, literals, offsets and lengths is emitted. The output stream occupies fewer bits than the source bit stream, but encodes all the data of the source bit stream.

30 Claims, 5 Drawing Sheets

ALTERNATIVE ENCODING FOR LZSS OUTPUT

FIELD

The invention relates to lossless data compression. More specifically, the invention relates to methods for improving compression ratios (decreasing the size of compressed data) and data formats that help compression and decompression operations to proceed quickly.

BACKGROUND

Contemporary data processing activities often produce, manipulate, or consume large quantities of data. Storing and transferring this data can be a challenging undertaking. One approach that is frequently productive is to compress the data so that it consumes less space. Data compression algorithms identify redundant or inefficiently-coded information in an input data stream and re-encode it to be smaller (i.e., to be represented by fewer bits). Various types of input data may have different characteristics, so that a compression algorithm that works well for one type of data may not achieve a comparable compression ratio (the ratio between the uncompressed and compressed data sizes) when processing another type of data.

No known compression algorithm achieves the best results for every data type; there is always an input data stream that an algorithm simply cannot make any smaller, though there is often a different algorithm that could re-encode the same data stream in a smaller number of bits. Sometimes, an algorithm operates in a way that both compresses a data stream and exposes additional redundancy or inefficient coding, so that a second compression stage could shrink the information even further. The design of an effective, general-purpose data compressor often involves trade-offs between the compression ratio and the number of stages (more stages typically increase compression and decompression processing time).

FIG. 2 shows how a popular and effective data compression algorithm works. The LZSS algorithm, named after its creators James Storer and Thomas Szymanski (who built on work by Abraham Lempel and Jacob Ziv), compresses a sequence of data symbols (e.g., data bytes) by identifying repeated sequences of symbols in the input, and replacing the sequences with smaller symbols. To compress the word "acacia," 210, an LZSS encoder 220 proceeds symbol by symbol (i.e., letter by letter), and produces the compressed sequence shown at 230. Reading from top to bottom, the compressed sequence contains a flag 231 that indicates what sort of information follows the flag. In the version of the LZSS algorithm depicted here, a flag value of 0 means that the following element 232 is a "literal," that is, it is exactly the same as the corresponding input symbol 212. The next flag 233 is also 0, and is followed by literal 234 (corresponding to input symbol 214). After processing two input symbols, the LZSS encoder 220 has increased the size of the output stream by two bits (the flag bits 231 and 233). However, LZSS encoder 220 next encounters symbols 218, the letters "ac," which are the same as the first two letters. Consequently, the encoder emits flag 235 (value 1), followed by an offset-length pair 236 that indicates a repetition of the two symbols located at offset 0. Compression is achieved if the offset and length information, plus the three flag bits, occupy less space than the first four input symbols. An LZSS implementation can adjust the number of bits allocated to offsets and lengths (among other parameters) to obtain satisfactory compression performance. (Typically, compression algorithms have poor performance on very short input streams, so the example discussed here should not be taken as indicative of LZSS's potential performance, but only of its general operational principles.)

Improvements to the generic LZSS algorithm described with reference to FIG. 2 may be useful and widely applicable.

BRIEF DESCRIPTION OF DRAWINGS

Embodiments of the invention are illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

DETAILED DESCRIPTION

An embodiment of the invention compresses an input data stream by applying Lempel-Ziv-Storer-Szymanski ("LZSS") processing to produce four intermediate data streams. The data in the intermediate streams are grouped or "packaged" into easy-to-manipulate portions, and some of the intermediate streams may be further compressed using other compression algorithms. Finally, the (possibly doubly-compressed) intermediate streams are emitted as a compressed data stream containing all of the information in the original input data stream. An embodiment may operate in the reverse direction to decompress a data stream prepared as described, thus recovering bit-for-bit the original input data stream.

Figure 1:
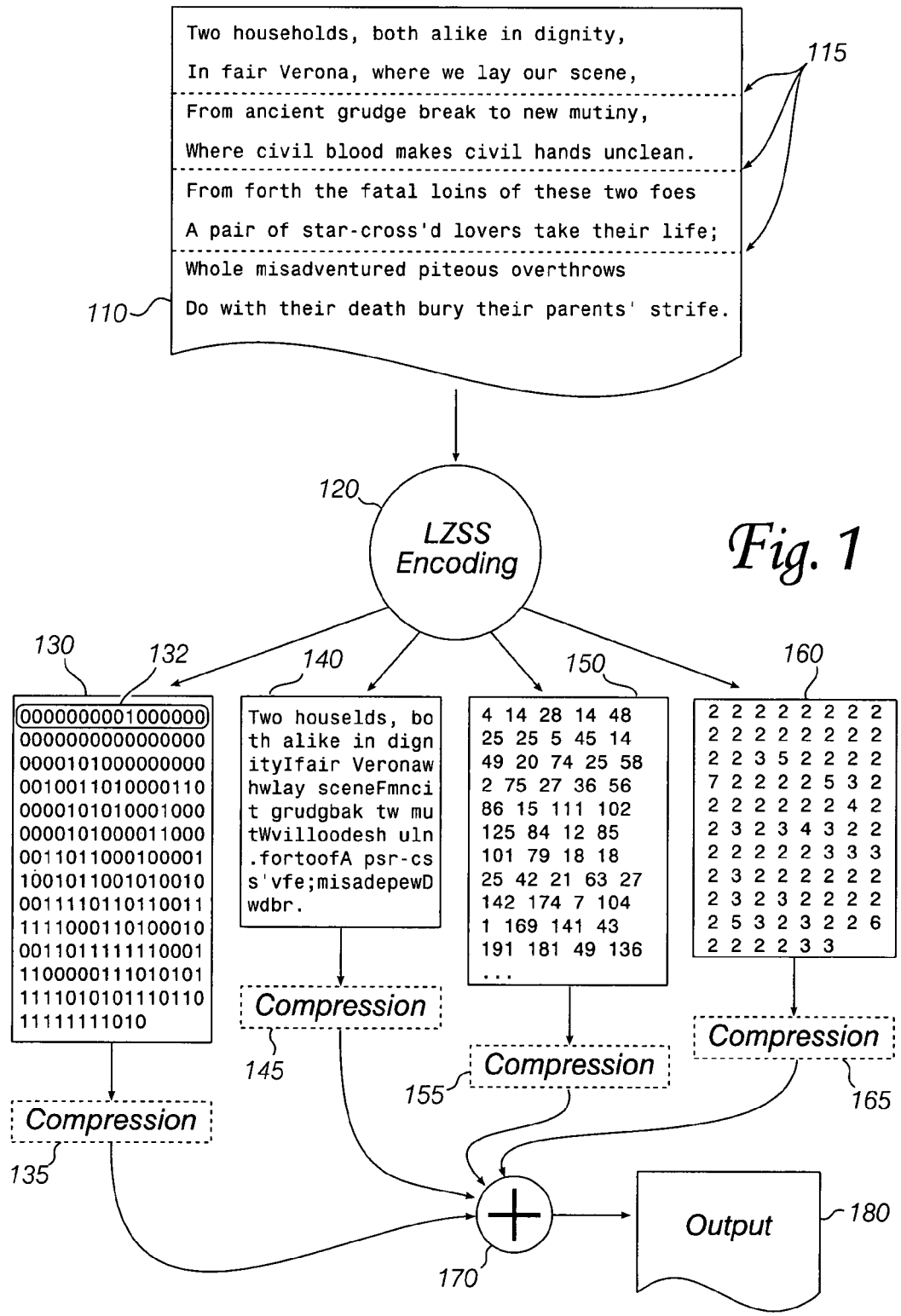
FIG. 1 is an overview of an LZSS-based compression process according to an embodiment of the invention.

FIG. 1 shows an input data stream 110 containing the first few lines of Shakespeare's Romeo and Juliet. An input data stream may come from a file or other stored data source, or it may be the output of a preceding data-processing operation. Embodiments of the invention can work in a "filter" mode, compressing data as it is received; the algorithms do not require simultaneous access to the complete data stream. (At least a small amount of buffering is required, however.) An input data stream may be broken into several "chunks" or "blocks," as indicated by dashed lines 115. Typically, each block (except perhaps the last) contains the same number of input data symbols. (By contrast, in FIG. 1 the block separators 115 split the input text into groups of two English lines, not into blocks containing the same number of letters.) Data to be compressed are often represented by a sequence of eight-bit "bytes," but embodiments of the invention can work on symbols represented by larger or smaller numbers of bits. The symbol size is usually chosen to be easily manipulated by a data processing device such as a computer that is to implement the methods of an embodiment.

Figure 2:
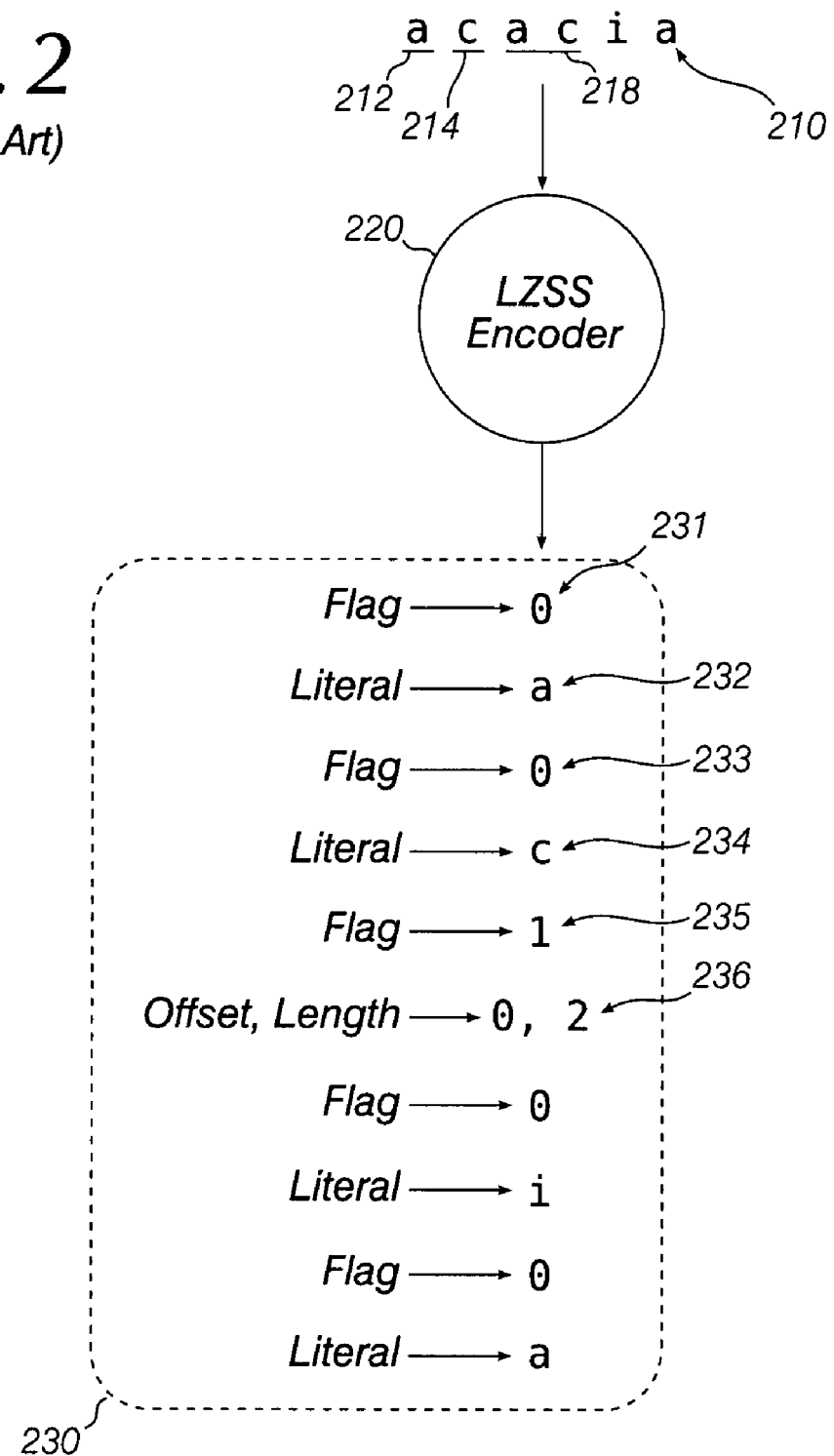
FIG. 2 shows how a basic LZSS compression algorithm operates.

Input data stream 110 is processed via LZSS encoding logic 120, which operates along the lines described above in reference to FIG. 2. In particular, LZSS encoding logic 120 produces four different streams of data based on input 110: a series of flag bits 130, a series of literal symbols 140, a series of offsets 150 and a series of lengths 160. The flag bits, symbols, offsets and lengths are produced alternately by the LZSS algorithm (i.e. first a flag, then either a literal or an offset/length pair, then another flag, and so on) but are sorted by type into the four intermediate streams 130, 140, 150 and 160. Elements of the four intermediate streams may be represented by different numbers of bits: flags can be represented by a single binary digit ("bit"); literals require the same number of bits as an input symbol; and (as mentioned earlier) the number of bits in an offset or length can be adjusted according to the desired characteristics of the LZSS compressor.

The LZSS encoding phase 120 processes the input symbol sequence 110 to remove repeated sub-sequences of input symbols, and produces the four derivative data streams 130, 140, 150 and 160. This achieves an initial degree of data compression for many input streams, and also reorganizes some of the information contained in the input stream. For example, the flag bit stream 130 accumulates information about whether a particular point in the input stream contains a sequence of symbols that appeared earlier in the input stream. For example, the first "1" entry in the flag bit stream corresponds to the second occurrence of the pair of characters "ho" in the word "households." The LZSS encoding detects the repetition and replaces the second pair of characters with the offset of the first pair and the length of the repeated sequence (in this case, 2).

The reorganization of information accomplished by the LZSS encoding phase 120 may expose additional opportunities to compress the data. Thus, an embodiment may compress some or all of the intermediate data streams 130, 140, 150 and 160; as shown by "Compression" boxes 135, 145, 155 and 165. Each intermediate stream may have characteristics that make it amenable to compression by a different algorithm (since the LZSS processing has already removed one sort of data redundancy, repeating the LZSS processing on the intermediate streams may be less effective, or even counterproductive). For example, the flags bit stream 130 and the lengths stream 160 may be amenable to compression using run-length encoding ("RLE"), where a sequence of identical values is replaced by a count of the identical values and a single copy of the repeated value. (When the RLE input data is a series of binary digits, the single copy can be omitted.) Using RLE, the first few lines of the flags intermediate stream 130 could be replaced by the numbers 9, 1, 26, 1, 1, 1, 10, 1, 2, 2 . . . . The first few lines of the lengths intermediate stream 160 could be replaced by (18,2), (1,3), (1,5), (4,2), and so on.

Other compression techniques that may be useful for compressing one or more of the intermediate streams include Huffman coding (described in a 1952 paper entitled "A Method for the Construction of Minimum-Redundancy Codes" by David A. Huffman); or arithmetic coding (described in U.S. Pat. No. 4,122,440 issued to Langdon et al) These compression techniques have been extensively studied, and modifications to improve their performance are well known. For example, the simplest Huffman and arithmetic coding algorithms are called "static," but better compression ratios are often achieved with more complex algorithms generally known as "adaptive" Huffman (or adaptive arithmetic). The latter algorithms frequently compress better, but at a cost of increased computation time. Both currently-existing and after-developed techniques may be used as well.

In a preferred embodiment, the flag stream is compressed using adaptive arithmetic coding, and the literals stream is compressed using a two-stage processing: the Burrows-Wheeler Transform (see "A Block Sorting Lossless Data Compression Algorithm" by Michael Burrows and David Wheeler, published 1994 in Research Report 124 of Digital Systems Research Center) followed by either adaptive Huffman or adaptive arithmetic coding.

Finally, the (possibly compressed) intermediate streams are combined, 170, and emitted as a compressed output stream 180. The compressed stream may be stored in a file, supplied as input to a subsequent processing step, or transmitted over a network to another data processing system.

Note that the "offsets" intermediate data stream 150 shown in FIG. 1 contains offsets measured from the beginning of the input data stream. Consequently, an implementation that worked as shown in this Figure would require that the complete input data stream from the beginning to the present processing location be available during both compression and decompression. This is impractical in many situations. An embodiment can relax this requirement by processing input data in fixed-size blocks, with the offset referring to the beginning of the block; or by using a sliding window with the offset indicating an earlier repeated sequence by its location relative to the current work location (i.e., a backwards or "negative" offset).

Embodiments of the invention may conveniently be implemented by a programmable data processing device such as a computer. As mentioned earlier, computers can often manipulate certain "natural" sizes of data more efficiently than arbitrarily-sized data. Natural sizes (in bits) are often powers of two, starting with eight: 8-bit bytes, 16-bit words, 32-bit long words, and 64-bit quad words (for example). An embodiment of the invention may obtain increased processing speed by grouping data in the intermediate streams into larger units that can be manipulated as natural-sized data elements. For example, flag bits (either before or after compression) may be grouped into flag units containing 8, 16, 32 or more flag bits. Offsets and lengths may also be sized and grouped to align with natural units. For example, an offset may be limited to five bits, and stored together with a three-bit length in an eight-bit byte. (Storing offsets and lengths together like this may defeat compression opportunities that are available when offsets are combined with other offsets and compressed, while lengths are combined with other lengths and compressed.) Data size and arrangement considerations are discussed in greater detail below.

Figure 3:
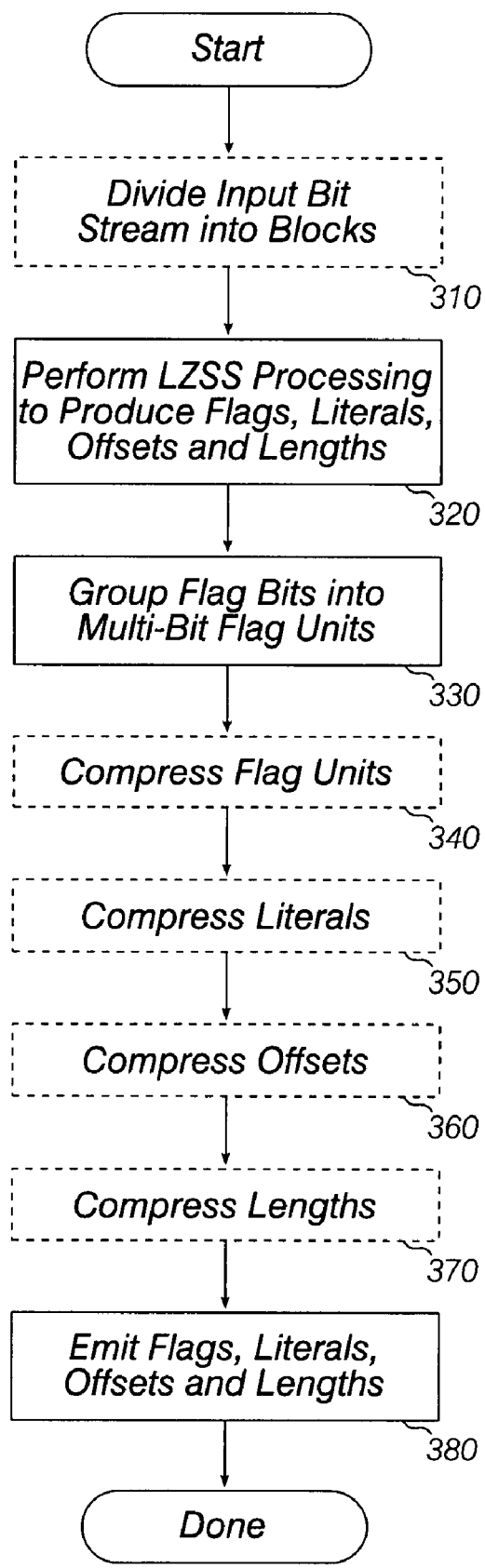
FIG. 3 is a flow chart of data compression operations performed by an embodiment of the invention.

Turning to FIG. 3, a data compression method according to an embodiment of the invention is depicted. First, an input bit stream may be divided into blocks (310). In some embodiments, each input block will be the same size (except for a final block, which may be smaller). Next, each block (or the whole input bit stream, if it is not divided into blocks) is processed using LZSS to produce flags, literals, offsets and length data (320). The flag bits are grouped into multi-bit flag units (330). Flag units may contain a natural number of bits for a programmable processor (e.g., 8 bits, 16 bits, 32 bits or 64 bits). In some embodiments, all the flag bits for the input data block may be grouped into a single flag unit. Next, secondary compression operations may be performed on the flag unit(s) (340), the literals (350), the offsets (360), and/or the lengths (370). Finally, the flags, literals, offsets and lengths are emitted as a compressed data stream (380).

Figure 4:
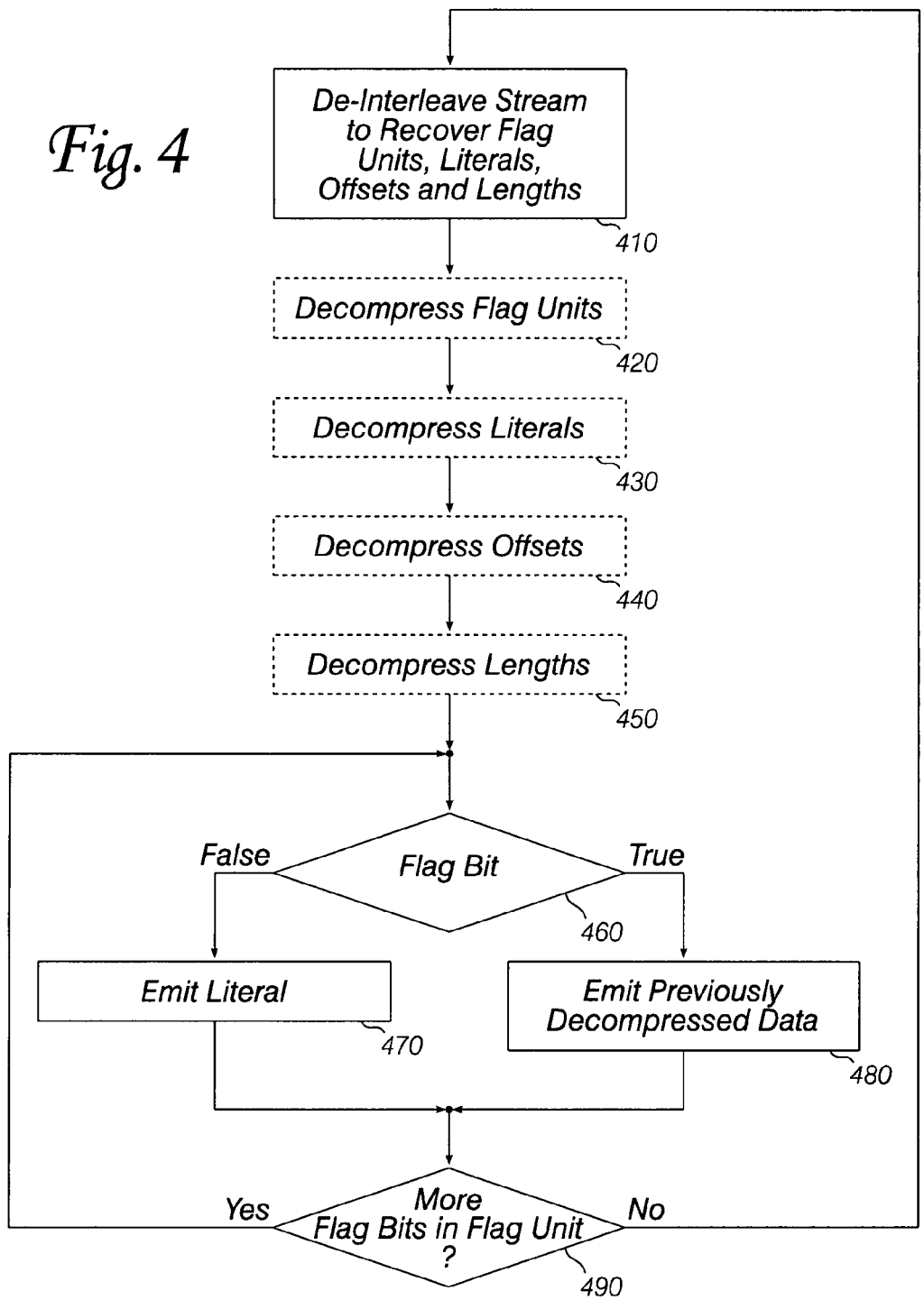
FIG. 4 outlines operations to decompress data that has been compressed by an embodiment of the invention.

FIG. 4 outlines the reverse operation, which decompresses a compressed data stream prepared as described above and reproduces the original input bit stream. First, the compressed stream is de-interleaved to recover the flag units, literals, offsets and lengths (410). Next, each of the intermediate data streams is decompressed if it was compressed during the original procedure: flag units decompressed (420), literals decompressed (430), offsets decompressed (440) and lengths decompressed (450). Then, for each flag bit in a flag unit, if the flag bit is false (460), a literal symbol from the literal intermediate stream is emitted (470). If the flag bit is true (460), then previously-decompressed data at the offset and length is repeated (480). If there are more flag bits in the flag unit (490), then the process is repeated, otherwise more compressed data from the compressed data stream is de-interleaved (410) and processed.

Figure 5:
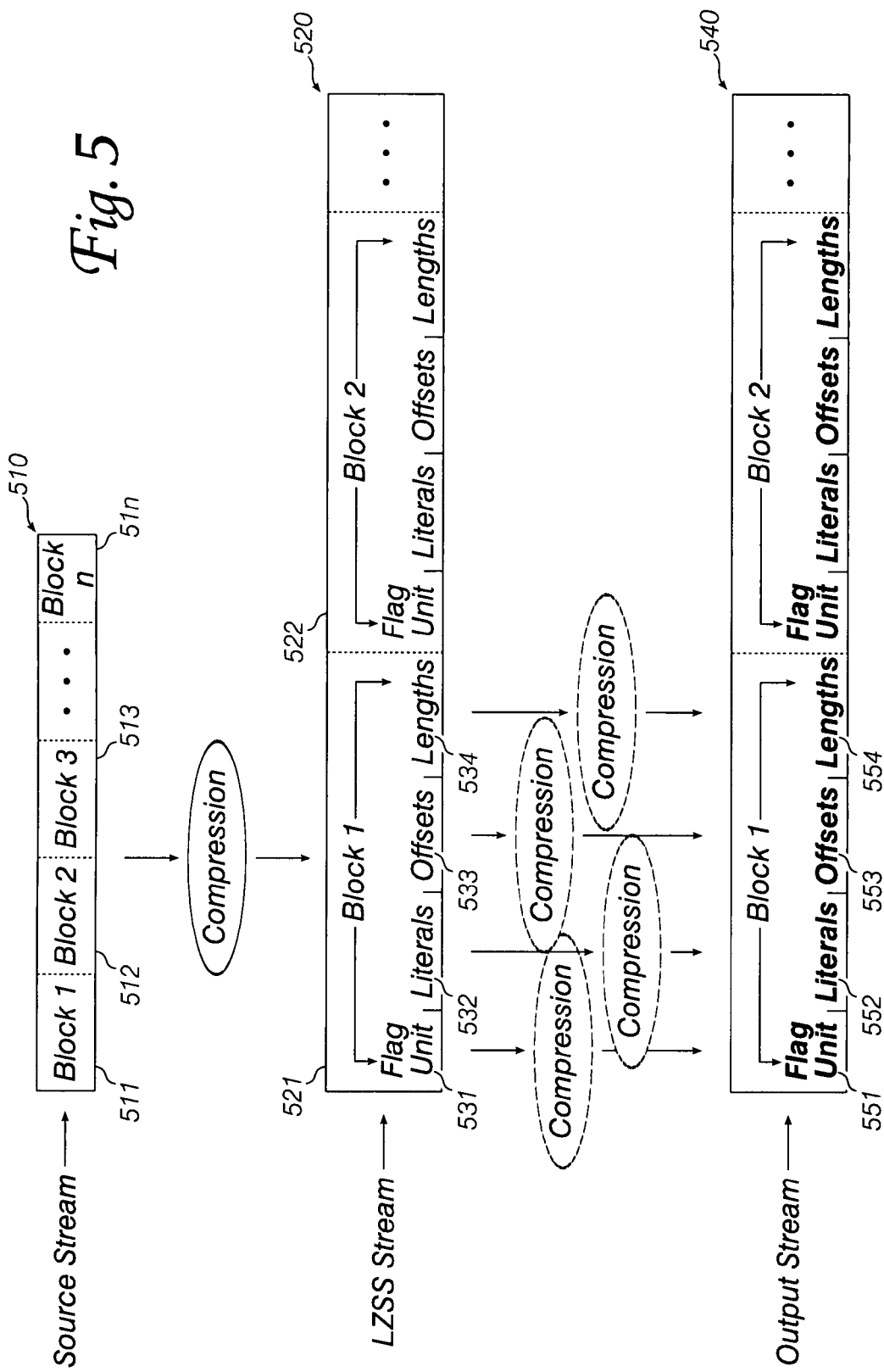
FIG. 5 shows a data format that can be produced by an embodiment of the invention.

FIG. 5 shows one possible arrangement of a compressed data stream prepared according to an embodiment of the invention. A source stream 510 may be divided into a plurality of equal-sized blocks 511, 512, 513 (and possibly one smaller block 51*n*). Each block is compressed as described above, yielding a corresponding plurality of compressed blocks 521, 522 (compressed blocks corresponding to 513 and 51*n* not shown in this Figure). Each compressed block includes a flag unit 531, literals 532, offsets 533 and lengths 534. These components may be completely segregated, as shown here, or may be interleaved in a way that permits efficient manipulation by a programmable processor. Each component may be separately compressed, resulting in a compressed flag unit 551, compressed literals 552, compressed offsets 553 and compressed lengths 554. The components may be interleaved at this stage, or placed into output stream 540 separately and successively, as shown here.

Several considerations guide the arrangement of compressed data to be placed in the output stream. First (and most important), the compressing and decompressing processes must use compatible arrangements. The compressed stream may contain flags or other indicators to control the operation of the decompressor. For example, a bit appearing in one of the intermediate data streams may indicate whether the intermediate stream is compressed, or a multi-bit flag may indicate which of several compression algorithms was used to compress the intermediate stream. Thus, in some embodiments, the compressed data stream may not have a fixed structure, but its actual structure is self-describing so that the decompressor can process it to recover the original source stream.

The LZSS compression algorithm produces (and the decompression algorithm consumes) one flag bit, then either a literal symbol or an offset/length pair, then another flag bit, and so on. Since each of these items comprises a different number of bits, they usually cannot be efficiently manipulated when interleaved in that way. Therefore, an embodiment of the invention groups the flag bits into multi-bit units, and may similarly group literals, offsets and lengths for easier processing. Since flag bits are produced first during compression, and required first during decompression, it is often convenient to place a flag unit ahead of the literals, offsets and lengths that the flag unit's flags describe. Grouping large numbers of flags, literals, offsets and lengths together may improve the compression ratios that can be achieved by the secondary compression algorithms operating on the four intermediate data streams, but these improvements must be balanced against the increased amount of buffer space required to decompress the intermediate streams and then to decode the four streams to reproduce the original input data.

One practical implementation may split an input stream into 4,096-byte ("4 KB") blocks, group all the flag bits for each block into a single flag unit, compress the flag unit using run-length encoding, and emit the compressed flag unit, the literals for the block, the offsets for the block and the lengths for the block onto the compressed output stream. Another practical implementation may use a 4 KB sliding window with 12-bit negative offsets, and group flag bits into flag units of 16 or 32 flag bits each, followed by the literals, offsets and lengths corresponding to the flag bits in the flag unit. Other implementations may choose different sizes for flag units and other groupings to tailor the implementation for execution by machines with different natural bit sizes, large or small buffer memories, etc.

An embodiment of the invention may be a machine-readable storage medium having stored thereon data and instructions to cause a programmable processor to perform operations as described above. In other embodiments, the operations might be performed by specific hardware components that contain hardwired logic. Those operations might alternatively be performed by any combination of programmed computer components and custom hardware components.

Instructions for a programmable processor may be stored in a form that is directly executable by the processor ("object" or "executable" form), or the instructions may be stored in a human-readable text form called "source code" that can be automatically processed by a development tool commonly known as a "compiler" to produce executable code. Instructions may also be specified as a difference or "delta" from a predetermined version of a basic source code. The delta (also called a "patch") can be used to prepare instructions to implement an embodiment of the invention, starting with a commonly-available source code package that does not contain an embodiment.

In the preceding description, numerous details were set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions were presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the preceding discussion, it is appreciated that throughout the description, discussions utilizing terms such as "processing" or "computing" or "calculating" or "determining" or "displaying" or the like, refer to the action and processes of a computer system or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, compact disc read-only memory ("CD-ROM"), and magnetic-optical disks, read-only memories (ROMs), random access memories (RAMs), eraseable, programmable read-only memories ("EPROMs"), electrically-eraseable read-only memories ("EEPROMs"), magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable storage medium includes any mechanism for storing information in a form readable by a machine (e.g., a computer). For example, a machine-readable medium includes a machine readable storage medium (e.g., read only memory ("ROM"), random access memory ("RAM"), magnetic disk storage media, optical storage media, flash memory devices, etc.), a machine readable transmission medium (electrical, optical, acoustical or other form of propagated signals (e.g., carrier waves, infrared signals, digital signals, etc.)), etc.

The applications of the present invention have been described largely by reference to specific examples and in terms of particular allocations of functionality to certain hardware and/or software components. However, those of skill in the art will recognize that efficient LZSS-based data compression algorithms can also be implemented by software and hardware that distribute the functions of embodiments of this invention differently than herein described. Such variations and implementations are understood to be captured according to the following claims.

I claim:

1. A method comprising:
   processing a source bit stream containing a sequence of source bits to produce a plurality of flag bits, a plurality of literals, a plurality of offsets and a plurality of lengths;
   grouping the flag bits into at least one flag unit, each flag unit containing more than eight flag bits; and
   emitting the at least one flag unit, the plurality of literals, the plurality of offsets and the plurality of lengths,
   wherein the at least one flag unit, literals, offsets and lengths together occupy fewer bits than the source bit stream, and
   wherein the at least one flag unit, literals, offsets and lengths encode all the source bits of the source bit stream.

2. The method of claim 1, further comprising:
   compressing at least one of the at least one flag unit, the literals, the offsets or the lengths before the emitting operation.

3. The method of claim 2 wherein a compression algorithm for a compressing operation is one of run-length encoding, Huffman coding or arithmetic encoding.

4. The method of claim 2, further comprising:
   compressing all of the at least one flag unit, the literals, the offsets and the lengths using adaptive arithmetic coding before the emitting operation.

5. The method of claim 2, further comprising:
   compressing all of the at least one flag unit, the literals, the offsets and the lengths using adaptive Huffman coding before the emitting operation.

6. The method of claim 2 wherein the at least one flag unit is at least two flag units, the method further comprising:
   compressing a first of the at least two flag units; and
   emitting a second of the at least two flag units without compression.

7. The method of claim 1 wherein processing the source bit stream comprises:
   dividing the source bit stream into a plurality of equal-sized blocks and no more than one smaller block; and
   producing a plurality of flag bits, a plurality of literals, a plurality of offsets and a plurality of lengths for each of the blocks.

8. The method of claim 7 wherein emitting comprises:
   emitting the at least one flag unit, the plurality of literals, the plurality of offsets and the plurality of lengths corresponding to a first block before emitting the at least one flag unit, the plurality of literals, the plurality of offsets and the plurality of lengths corresponding to a second, subsequent block.

9. The method of claim 7 wherein all of the flag bits corresponding to a block are grouped into exactly one flag unit corresponding to the block.

10. A method comprising:
    processing an input symbol sequence to remove repeated sub-sequences of input symbols and produce a plurality of derivative data streams, a first of the derivative data streams consisting exclusively of a series of binary flags;
    compressing the first derivative data stream using a first compression algorithm;
    compressing a second derivative data stream using a second, different compression algorithm; and
    outputting an output symbol sequence containing the compressed first derivative data stream and the compressed second derivative data stream.

11. The method of claim 10 wherein the first compression algorithm and the second compression algorithm are chosen from the set consisting of run-length encoding, Huffman coding and arithmetic coding.

12. The method of claim 10 wherein the input symbol sequence is a first block of an input file, the method further comprising:
    repeating the processing, compressing and outputting operations on a second block of the input file, the second block containing an equal number of symbols as the first block.

13. A method comprising:
    processing a compressed bit stream containing four interleaved classes of compressed data, the classes identified as flag units, literal data units, offset data units and length data units;
    recovering more than eight flag bits from a flag unit;
    emitting a literal data unit to a decompressed output stream for each flag bit having a first binary value; and
    emitting a plurality of data units copied from the decompressed output stream for each flag bit having a second binary value, a number of the plurality of data units expressed by a length data unit, and an offset within the decompressed output stream of the plurality of data units expressed by an offset data unit.

14. The method of claim 13 wherein recovering the at least eight flag bits from a flag unit comprises decompressing the flag unit using one of a run length encoding algorithm, a Huffman coding algorithm, or an arithmetic coding algorithm.

15. The method of claim 13 wherein the compressed bit stream encodes a plurality of equal-sized blocks of decompressed data plus at most one smaller block of decompressed data, and wherein recovering more than eight flag bits from a flag unit comprises recovering all flag bits corresponding to one of the blocks from a flag unit corresponding to the one of the blocks.

16. The method of claim 15 wherein a size of each of the equal-sized blocks of decompressed data is a power of two.

17. The method of claim 13, further comprising:
decompressing at least one of the literal data units, the offset data units or the length data units.

18. The method of claim 17, further comprising:
decompressing the literal data units using arithmetic encoding,
decompressing the offset data units using Huffman coding; and
decompressing the length data units using run-length encoding.

19. A machine-readable storage medium containing data and instructions to cause a programmable processor to perform operations comprising:
processing a source bit stream containing a sequence of source bits to produce a plurality of flag bits, a plurality of literals, a plurality of offsets and a plurality of lengths;
grouping the flag bits into at least one flag unit, each flag unit containing more than eight flag bits; and
emitting the at least one flag unit, the plurality of literals, the plurality of offsets and the plurality of lengths,
wherein the at least one flag unit, literals, offsets and lengths together occupy fewer bits than the source bit stream, and
wherein the at least one flag unit, literals, offsets and lengths encode all the source bits of the source bit stream.

20. The machine-readable storage medium of claim 19, wherein the operations further comprise:
compressing at least one of the at least one flag unit, the literals, the offsets or the lengths before the emitting operation using at least one of adaptive arithmetic coding and adaptive Huffman coding.

21. The machine-readable storage medium of claim 20, wherein the at least one flag unit is at least two flag units, the operations further comprising:
compressing a first of the at least two flag units; and
emitting a second of the at least two flag units without compression.

22. The machine-readable storage medium of claim 19, wherein processing the source bit stream comprises:
dividing the source bit stream into a plurality of equal-sized blocks and no more than one smaller block; and
producing a plurality of flag bits, a plurality of literals, a plurality of offsets and a plurality of lengths for each of the blocks.

23. A machine-readable storage medium containing data and instructions to cause a programmable processor to perform operations comprising:
processing an input symbol sequence to remove repeated sub-sequences of input symbols and produce a plurality of derivative data streams, a first of the derivative data streams consisting exclusively of a series of binary flags;
compressing the first derivative data stream using a first compression algorithm;
compressing a second derivative data stream using a second, different compression algorithm; and
outputting an output symbol sequence containing the compressed first derivative data stream and the compressed second derivative data stream.

24. The machine-readable storage medium of claim 23, wherein the input symbol sequence is a first block of an input file, the operations further comprising:
repeating the processing, compressing and outputting operations on a second block of the input file, the second block containing an equal number of symbols as the first block.

25. A machine-readable storage medium containing data and instructions to cause a programmable processor to perform operations comprising:
processing a compressed bit stream containing four interleaved classes of compressed data, the classes identified as flag units, literal data units, offset data units and length data units;
recovering more than eight flag bits from a flag unit;
emitting a literal data unit to a decompressed output stream for each flag bit having a first binary value; and
emitting a plurality of data units copied from the decompressed output stream for each flag bit having a second binary value, a number of the plurality of data units expressed by a length data unit, and an offset within the decompressed output stream of the plurality of data units expressed by an offset data unit.

26. The machine-readable storage medium of claim 25, wherein recovering the at least eight flag bits from a flag unit comprises decompressing the flag unit using one of a run length encoding algorithm, a Huffman coding algorithm, or an arithmetic coding algorithm.

27. The machine-readable storage medium of claim 25, wherein the compressed bit stream encodes a plurality of equal-sized blocks of decompressed data plus at most one smaller block of decompressed data, and wherein recovering more than eight flag bits from a flag unit comprises recovering all flag bits corresponding to one of the blocks from a flag unit corresponding to the one of the blocks.

28. The machine-readable storage medium of claim 25, wherein a size of each of the equal-sized blocks of decompressed data is a power of two.

29. A system comprising:
a memory to store a source bit stream containing a sequence of source bits; and
a processor, coupled to the memory, to process the source bit stream to produce a plurality of flag bits, a plurality of literals, a plurality of offsets and a plurality of lengths, to group the flag bits into at least one flag unit, each flag unit containing more than eight flag bits, and to emit the at least one flag unit, the plurality of literals, the plurality of offsets and the plurality of lengths,
wherein the at least one flag unit, literals, offsets and lengths together occupy fewer bits than the source bit stream, and
wherein the at least one flag unit, literals, offsets and lengths encode all the source bits of the source bit stream.

30. A system comprising:
a memory to store a compressed bit stream containing four interleaved classes of compressed data, the classes identified as flag units, literal data units, offset data units and length data units; and
a processor, coupled to the memory, to process the compressed bit stream, to recover more than eight flag bits from a flag unit, to emit a literal data unit to a decompressed output stream for each flag bit having a first binary value, and to emit a plurality of data units copied from the decompressed output stream for each flag bit having a second binary value, a number of the plurality of data units expressed by a length data unit, and an offset within the decompressed output stream of the plurality of data units expressed by an offset data unit.

* * * * *